(12) United States Patent
Ning et al.

(10) Patent No.: US 10,536,107 B1
(45) Date of Patent: Jan. 14, 2020

(54) SATELLITE MODULAR POWER SUPPLY

(71) Applicant: Vector Launch Inc., Tucson, AZ (US)

(72) Inventors: Andrew Daichi Ning, Yorba Linda, CA (US); George Lewis Teel, Seal Beach, CA (US); Brian James Riskas, Nipomo, CA (US); Darren D. Garber, Ranchos Palos Verdes, CA (US)

(73) Assignee: Vector Launch Inc., Tucson, AZ (US)

( * ) Notice: Subject to any disclaimer, the term of this patent is extended or adjusted under 35 U.S.C. 154(b) by 4 days.

(21) Appl. No.: 16/156,170

(22) Filed: Oct. 10, 2018

(51) Int. Cl.
| | |
|---|---|
| *H02S 10/40* | (2014.01) |
| *H01M 10/46* | (2006.01) |
| *H02S 40/38* | (2014.01) |
| *H02J 7/35* | (2006.01) |
| *H01M 10/0525* | (2010.01) |
| *H01M 10/625* | (2014.01) |
| *B64G 1/42* | (2006.01) |
| *B64G 1/10* | (2006.01) |
| *B64G 1/44* | (2006.01) |
| *H01M 10/615* | (2014.01) |

(52) U.S. Cl.
CPC ............... *H02S 10/40* (2014.12); *B64G 1/10* (2013.01); *B64G 1/425* (2013.01); *B64G 1/428* (2013.01); *B64G 1/44* (2013.01); *H01M 10/0525* (2013.01); *H01M 10/465* (2013.01); *H01M 10/615* (2015.04); *H01M 10/625* (2015.04); *H02J 7/355* (2013.01); *H02S 40/38* (2014.12); *H01M 2220/20* (2013.01)

(58) Field of Classification Search
CPC ........... H01L 31/052; B64G 2001/1092; H02S 10/40; H02S 40/38
USPC ....... 455/427, 428, 12.1, 13.3, 13.4, 522, 69
See application file for complete search history.

(56) References Cited

U.S. PATENT DOCUMENTS

| | | | |
|---|---|---|---|
| 2005/0068238 A1* | 3/2005 | Haaft | H01Q 1/125 343/757 |
| 2017/0047987 A1* | 2/2017 | Pellegrino | H03F 3/19 |
| 2018/0251241 A1* | 9/2018 | Burt | B64G 1/50 |

* cited by examiner

*Primary Examiner* — John J Lee

(57) ABSTRACT

Various enhanced power supply configurations for satellite devices are discussed herein. In one example, satellite device includes a chassis and a power control module. The satellite device also includes an array of polygonal-shaped power units combined into a geometric arrangement by disposing the polygonal-shaped power units around the power control module within the chassis. In some examples, the polygonal-shaped power units comprise a rhomboid chassis or enclosure that provides arrangement into a hexagonal array when coupled to eight further rhomboid power units. Other polygonal arrays can be formed using arrangements of the repeating polygonal-shaped power units.

20 Claims, 8 Drawing Sheets

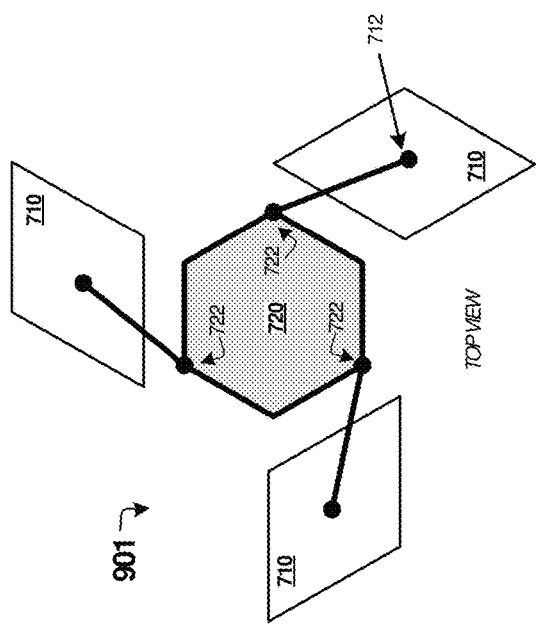
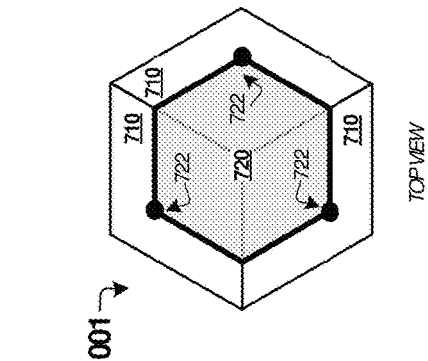
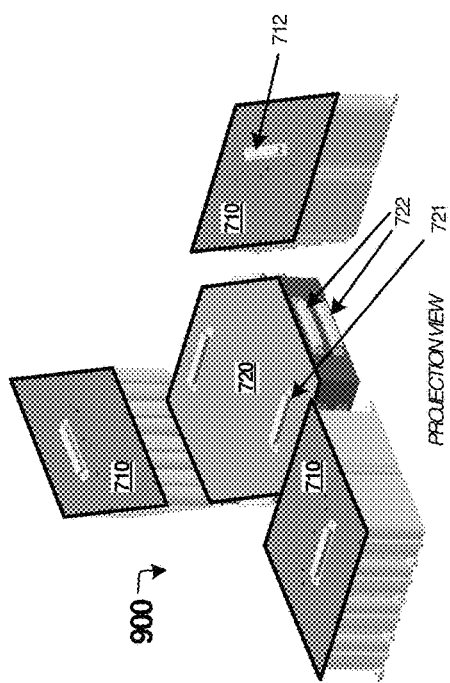
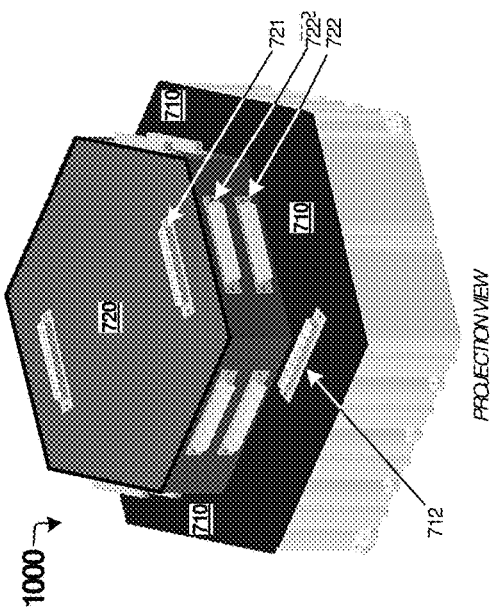
FIGURE 9
FIGURE 10

SATELLITE MODULAR POWER SUPPLY

BACKGROUND

Satellites can be deployed into orbit to provide various space-based operations, such as military and civilian observation operations, communications operations, navigation operations, weather operations, and research operations. Satellites can include various sensors and communication equipment that are used to perform desired tasks. However, most satellites deployed in orbit comprise custom-made components that are expensive to create. Organizations that desire to deploy satellite devices may not have in-house resources to design and build satellites customized to specific needs or applications. Moreover, these organizations may not require the use of an entire satellite with a large number of sensors, or may not require continuous operations on an entire satellite. As a result, organizations may avoid the use of satellites, limiting the use of promising satellite technology.

Furthermore, when many satellites are to be deployed, then custom design, machining, manufacturing, and implementation can all add significantly to the development costs. The structural bodies of orbital satellites, space-faring probes, and some spacecraft are typically custom-made or handmade. These structural bodies, referred to herein as spacecraft buses, are normally machined, cut, bonded, or molded, using very labor-intensive techniques. Each resulting spacecraft bus is semi-custom. Due to the handmade nature of these items, portions of a spacecraft bus tend to be irregular, at least to some extent. Not only are spacecraft buses time-consuming to manufacture, but the cost is considerable as well. Furthermore, the resulting buses are not uniform.

CubeSats have been recently introduced and comprise satellite devices having a uniform, albeit small, size that allows for a more consistent manufacturing process. Nevertheless, the efficiency of CubeSat production can be improved. Moreover, the small size of CubeSats limits the quantity of internal components as well as the provided functionality.

Overview

Various enhanced power supply configurations for satellite devices are discussed herein. In one example, satellite device includes a chassis and a power control module. The satellite device also includes an array of polygonal-shaped power units combined into a geometric arrangement by disposing the polygonal-shaped power units around the power control module within the chassis. In some examples, the polygonal-shaped power units comprise a rhomboid chassis or enclosure that provides arrangement into a hexagonal array when coupled to eight further rhomboid power units. Other polygonal arrays can be formed using arrangements of the repeating polygonal-shaped power units.

This Overview is provided to introduce a selection of concepts in a simplified form that are further described below in the Technical Disclosure. It should be understood that this Overview is not intended to identify key features or essential features of the claimed subject matter, nor should it be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

FIG. 9 illustrates a sparse hexagonal configuration of power units according to an implementation.

FIG. 10 illustrates a compact hexagonal configuration of power units according to an implementation.

DETAILED DESCRIPTION

Figure 1:
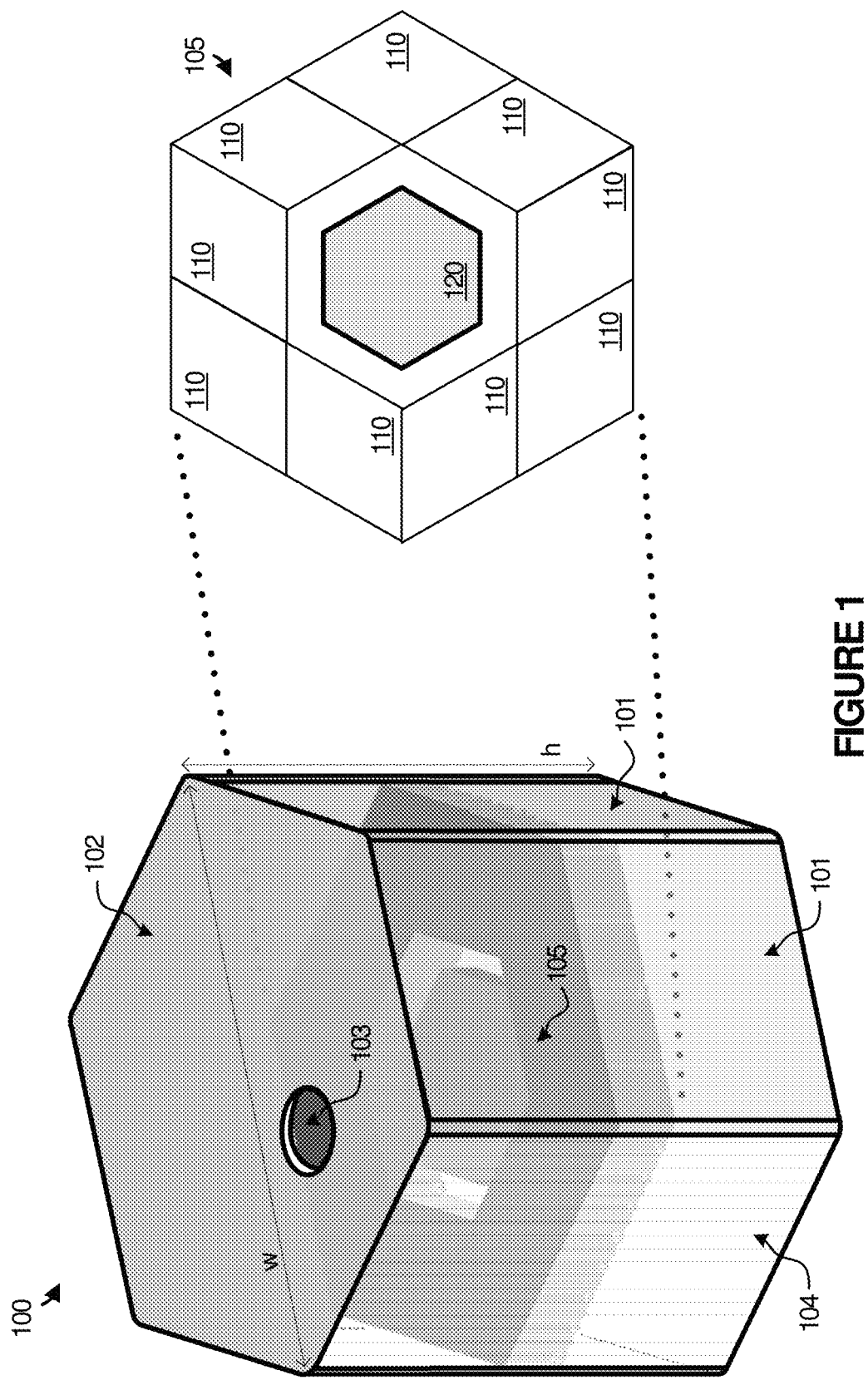
FIG. 1 illustrates a satellite device according to an implementation.

The various examples disclosed herein provide enhancements for satellite hardware technology. Specifically, the examples herein include enhanced power systems and power supply elements for satellite devices. These satellites can be deployed into orbit or into various trajectories through space using a launch platform. Structures of the satellites can vary, but in the examples herein a hexagonal based chassis or "bus" is employed. Other polygonal shapes might be employed using similar concepts. Moreover, although satellite devices are discussed throughout, it should be understood that the enhancements herein can be applied to any non-device or system which employs a power supply or power system.

The satellite devices discussed herein can be placed into various arrangements to form a satellite platform. For example, a cluster of satellite devices can be deployed into orbit using a launch system. These satellite devices can comprise general-purpose satellite devices, such as the hexagonal buses discussed herein, or might instead comprise arbitrary shapes or CubeSat devices. These satellite devices can be configured with processing systems, storage systems, and communication systems. These satellite devices can also have specialized roles which can be defined according to provisioned hardware or software elements, or can be associated with a particular set of applications deployed to the associated satellite devices. In some examples, satellite devices can be placed within a similar orbital path to form a cluster of satellites, which might comprise one or more clustered rings of satellites orbiting Earth. This clustered ring arrangement provides for enhanced communications, redundancy, ground coverage, and fault-tolerance, among other operations.

To form the power systems discussed herein, a modular approach is taken. Each power module, referred to herein as a power unit, is shaped into a polygonal solid shape. For example, rhomboid shapes might be employed in some examples, whereas trapezoid shapes might be employed in other examples. Typically, a geometric prism configuration is employed regardless of the overarching polygonal shape, such as a rhomboid prism, hexagonal prism, or trapezoid prism. Thus, a rhomboid shape discussed herein will have a rhomboid upper surface positioned above a rhomboid lower surface, with an enclosure filling the space between the upper and lower surface. Any polygonal upper/lower surfaces might be employed with an associated enclosure filling space between the surfaces and according to a translated version of the surfaces. Although edges and faces of the prism shape might have any geometrically-allowed angles (such as oblique angles), in the examples herein the prisms comprise right prisms having vertical sides formed by quadrilaterals or parallelograms. Thus, side faces of the prisms comprise squares or rectangles.

A collection or arrangement of more than one power unit can be disposed together in a common plane into a geometric array forming a generally ring-shaped configuration. When rhomboid power units are employed, for example, nine power units can be arrayed into a hexagonal ring. Adjacent edges of each power unit abut a neighboring power unit. Although not required, adjacent power units can be fastened or coupled together. This ring configuration can be positioned around a central power control hub module which can act as a power control system for the individual power units. In further examples, ring configurations are not employed, and instead a filled-space, compact, sparse, or partially-filled configuration are employed. Thus, any number between a maximum and minimum quantity of power units can be populated in an array.

Advantageously, modular polygonal power units can be arrayed into varying arrangements depending upon the power needs and functional requirements of the satellite devices. Power levels might be variable, from hundreds of watts for a single modular unit, to more than a kilowatt for a fully populated array. Deployment can be enhanced by allowing satellite deployers to select a quantity of power units and arraying the power units onto a satellite bus without needing to develop or design custom power supply systems for each satellite device. Moreover, the arrangements can be formed using selected polygonal unit shapes to form combined shapes which fit into the spacing allotted for a particular satellite device, such as hexagonal space. A common or shared control unit can be included to handle any number of power units and distribute power to satellite systems. In this manner, a selected quantity of solar panels can be coupled to a power unit which then provides battery backed-up power to a control unit acting as a central power hub.

FIG. 1 illustrates satellite device 100 according to an implementation. In FIG. 1, a hexagonal-shaped satellite device is shown as an example configuration. Satellite device 100 is formed from a shell of material, such as composite panels, metal panels, or other materials that form a generally hollow central cavity. One or more internal shelves, decks, or bays can be formed into the generally hollow cavity, as well as one or more apertures, such as aperture 103 for deployment of external features. Additionally, one or more photovoltaic solar panels or solar arrays might be employed. In FIG. 1, panel 104 comprises a photovoltaic solar panel. A second photovoltaic solar panel might be included on a side of satellite device 100 opposite of panel 104, as well as further photovoltaic solar panels. Armatures or mounts might be included to position the photovoltaic solar panels to capture sunlight, which might be in a different orientation or direction than satellite device 100.

Satellite device 100 may include any suitable number of side panels 101. As shown in FIG. 1, satellite device 100 may include six side panels 101 forming a hexagon. When satellite device 100 forms a hexagon, the angle α between the front surface of each side panel is 30°. The hexagon shape is efficient for fitting into a void created by a payload fairing of a rocket. Alternatively, satellite device 100 may include four side panels forming a square with an angle α of 45° between the front surface of each side panel. When satellite device 100 includes five side panels forming a pentagon, the angle α is 36° between the front surface of each side panel. When satellite device 100 includes seven side panels forming a heptagon, the angle α is 25.7° between the front surface of each side panel. When satellite device 100 includes eight side panels forming an octagon, the angle α is 22.5° between the front surface of each side panel. Each shape can be selected based on application, launch platform restrictions, weight requirements, payload enclosure requirements, or other application requirements. In other examples, the shape and angle α can be selected to best suit on-board components of the satellite bus, such as solar panels, communication antennas, imaging sensors, propulsion components, inertial adjustment components, or other components.

A top panel 102 and corresponding bottom panel can be included in satellite device 100. These panels might include one or more apertures to support propulsion components. These propulsion components can include external nozzles, engines, grids, electrodes, or other suitable propulsion extensions from satellite device 100. An internal chamber might be formed using a corresponding internal deck to separate propulsion components from avionics, power, and sensing components.

Overall, satellite device 100 may have an overall height between about 35 cm and 45 cm, between about 20 cm and 35 cm, or between about 45 cm and 75 cm. Satellite device 100 may have a diameter (w) of approximately 45 cm, such as between about 35 cm and 45 cm, or between about 45 cm and 75 cm, or between about 75 cm and 100 cm. The structure of satellite device 100, on its own, may weigh between about 500 grams and 1000 grams, or between about 750 grams and 1500 grams, or between about 1500 grams and 6000 grams. It should be understood that satellite device 100 can have other dimensions and weights.

Satellite device 100 may either be hollow to house a single chamber of internal components, or the satellite bus may include one or more decks or other externals to house more than one chamber of internal components. Each of side panels 101 may have one or more molded features formed into a back surface facing the inside of satellite device 100. The molded features may be designed to hold one or more decks or other internals or externals in place. The molded features may include one or more tabs, fasteners, bonded areas, embossments, or shelves, either for securing a deck, power system components, or for any other purpose.

Internal decks may be a propulsion deck or an avionics deck, for example. The avionics deck may include a sun sensor, a star tracker, radio frequency (RF) transceivers, optical transceivers, reaction wheels, wire harnesses, power bus, internal heat radiator connections, and/or any other avionics features. The decks can be attached to the back surface of each of the side panels using any of the aforementioned features on the back surfaces of the side panels. Satellite device 100 may also include internal heat radiator connections, such as one or more thermal straps, secured to the inside of satellite device 100 to conduct heat from inside the satellite to the exterior of the satellite through one or more apertures in side panels, top panel, or bottom panel, such as aperture 103. According to certain examples, each of the side panels 101 may have a mounting flange on the front surface. The mounting flange can be used to attach a solar panel or a window to the front surface of the respective side panel. Using a flange to mount the solar panels or windows results in fewer layers in satellite device 100, thereby reducing the overall weight of satellite device 100. In FIG. 1, photovoltaic solar panel 104 is shown as an example solar panel.

One of the advantages of satellite device 100 is that the design is modular, so the structure is formed by panels, namely side panels, a top panel, and a bottom panel. The side panels can all be formed from the same manufacturing die. The side panels can have predetermined features to hold decks and other equipment, in accordance with user specifications. The predetermined features may be obtained either by using a single die that includes the desired features for each of the side panels, or by modifying a single die to include, for example, a molded feature, tabs, fasteners, bonded areas, embossments, or shelves. Consequently, satellite device 100 can be made available as a kit and assembled by a user. Alternatively, satellite device 100 can be manufactured according to user specifications, in modular form, and subsequently transferred to the user for final assembly. The internal features of the satellite may be pre-assembled and mounted inside satellite device 100 before either the user or the manufacturer seals satellite device 100.

One example internal component of satellite device 100 is power system 105. Power system 105 can be mounted internally into satellite device 100, and is formed from individual modular units 110. These modular units can be referred to herein as power units or power slices. A shared power control module 120 is also included in power system 105. This shared power control module 120 might instead be referred to herein as power control hub, power control system, or power control unit. The perspective view of satellite device 100 shows power system 105 mounted internally and from an angle to illustrate the thickness and size with respect to a chassis or bus of satellite device 100. A top view of power system 105 is also included in FIG. 1 which illustrates further detail of individual components. A further discussion of the structure of power system 105 is discussed below in FIGS. 3-10.

As will be discussed herein, the structure and composition of power system 105 is formed by several modular power units 110. In FIG. 1 these modular power units 110 have a rhomboid shape when viewed from above, and form a hexagonal composite shape when disposed together. Nine rhomboid power units can be positioned together to form a fully-populated hexagonal configuration. Fewer than nine power units might instead be included, or more than nine power units when additional layers of power units are employed. In this manner, a selected number of power units can be deployed into satellite device 100 to suit the power requirements of the application. A power output of a solar panel or solar array might be coupled to each power unit, and each power unit can be coupled to a common or shared power control unit, such as power control module 120. Power control module 120 is positioned inside of a central void or cavity formed when the rhomboid power units are formed into a hexagonal shape. The hexagonal shape matches that of satellite device 100. Thus, when other shapes are employed for satellite device 100, the internal power units can be arrayed to suit this shape. Moreover, the shape of each power unit might be of a different sort than rhomboid to effectively array the power units within a corresponding satellite shape.

Figure 2:
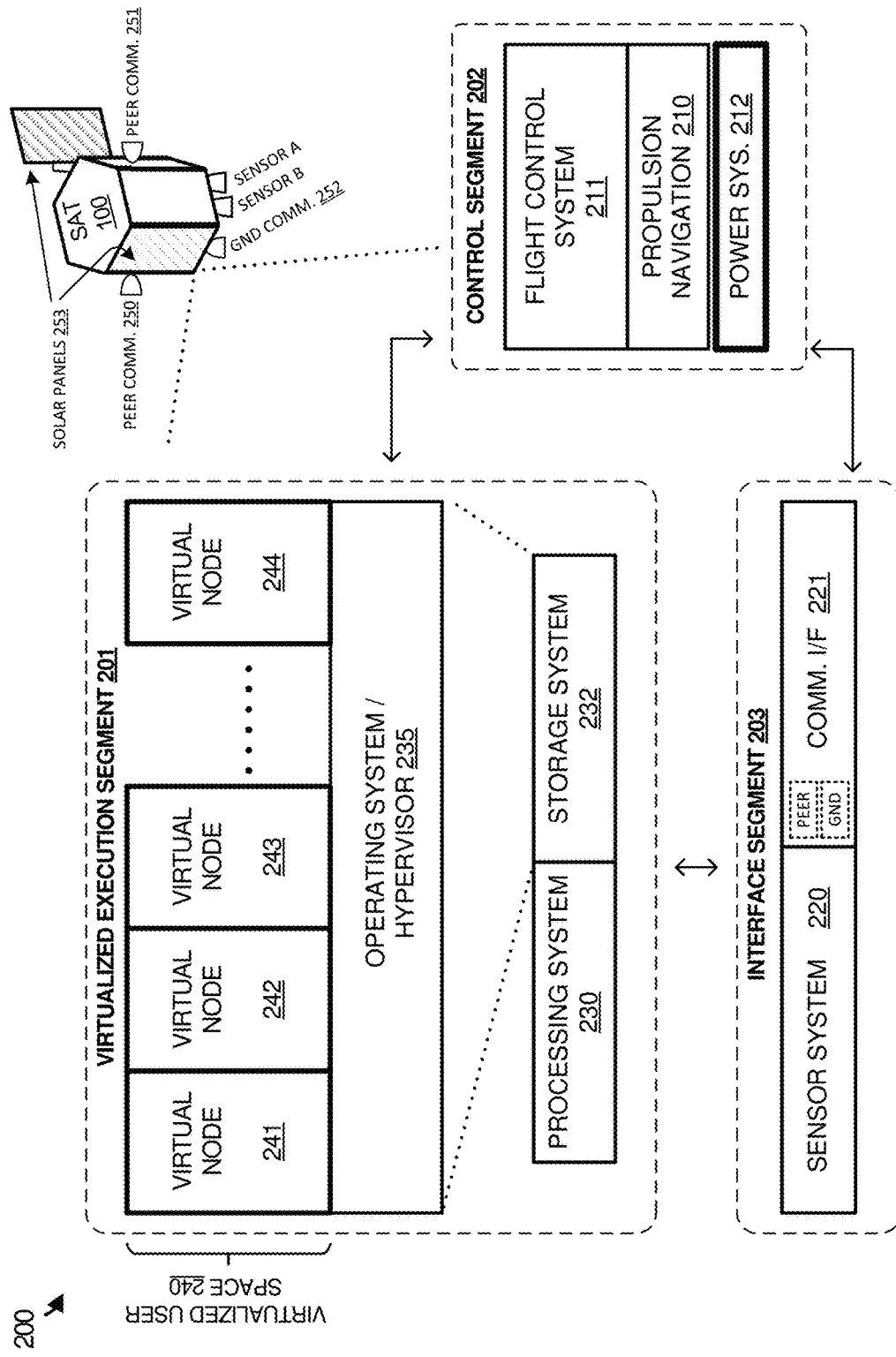
FIG. 2 illustrates an example expanded view of a satellite device.

Turning now to a schematic representation of satellite device 100, FIG. 2 is presented. FIG. 2 illustrates an expanded view 200 of an exemplary satellite device 100 from FIG. 1, which is capable of providing a platform for various satellite functions. In FIG. 2, satellite device 100 includes one or more virtual nodes according to an implementation. Any satellite devices described herein can include similar features.

In FIG. 2, one or more virtual nodes 241-244 are provided in satellite device 100. Satellite device 100 includes virtualized execution segment 201, control segment 202, and interface segment 203, which may be coupled using various communication links. Virtualized execution segment 201 is representative of a virtualized execution system, which includes a virtualized user space 240 for virtual nodes 241-244, an operating system or hypervisor 235, a storage system 232 to store the operating system and virtual user space, and a processing system 230. Control segment 202 further includes flight control system 211, power system 212, and propulsion navigation 210. Interface segment 203 further includes user sensor system 220 and communication interface 221.

Communication interface 221 may be used for ground (gnd) communication and inter-satellite (peer) communication. The peer communications may be provided by a transceiver and/or antenna system, indicated by elements 250-251 in FIG. 2. The ground communications may be provided by a transceiver and/or antenna system, indicated by element 252 in FIG. 2. Elements 250-252 can each comprise separate transceivers/antenna systems, although in some examples portions thereof may be shared. In some examples, a common communication interface can be shared by both virtualized execution system 201 and control segment 202. However, in further examples, control segment 202 might have a dedicated pathway and transceiver/antenna system for separate communication with a ground system. Moreover, in further examples, virtualized execution system 201 can have a dedicated pathway for separate communication with peer satellite devices.

Satellite device 100 can include one or more sensor devices provided by sensor system 220. Sensor system 220 can comprise imaging sensors, temperature sensors, light sensors, signal quality sensors, or some other similar sensor capable of interaction with virtual nodes 241-244. In FIG. 2, sensors 'A' and 'B' are shown as illustrative of downward-facing sensors. It should be understood that other sensors can be included, such as star sensors, position sensors, space imaging sensors, radiation detectors, or other sensors.

Power system 212, power control module 120, and individual power units 110 can comprise elements found below in FIG. 3. Furthermore, as detailed herein, battery arrays are included in elements of satellite 100, specifically in power system 212. Associated power distribution circuitry, power control circuitry and logic, power distribution switches, shunts, dummy loads, heat radiators, enclosures, cases, circuit boards can be included to form elements of power system 212.

Solar panels 253 each comprise an array of photovoltaic cells or photovoltaic elements capable of generating electrical power responsive to incident light. In operation, solar panels 253 will be positioned to receive incident sunlight to produce direct current (DC) outputs of a particular voltage. The output voltage can vary depending on the intensity of the incident sunlight and composition or arrangement of the solar cells. The individual solar cells might comprise silicon-based wafers or thin film solar cells, among others. Various series or parallel connections of solar cells can be made to produce desired output currents and voltages, as well as for redundancy and failure mitigation. In addition to the solar arrays, various support structures, chassis, frames, armatures, mounts, encasements, deployers, locking mechanisms, positioning manipulators, positioning servos or motors can be included. Moreover, various control circuitry can be included in power system 212 or flight control system 211 to control deployment, positioning, orientation, and power shunts/switching associated with solar panels 253.

As described herein, organizations may generate applications that are capable of being deployed as virtual nodes on one or more satellites of a satellite platform. These applications may be provided from a ground control system, or may be provided from another satellite via communication interface 221 on satellite device 100. Once the applications are provided, operating system/hypervisor 235, which is stored on storage system 232 and executed by processing system 230 may provide a platform for the execution of the applications. Here, each application provided to satellite device 100 is executed as a separate virtual node in virtual nodes 241-244, wherein the virtual nodes may comprise full operating system virtual machines or containers capable of sharing resources from the underlying operating system in storage system 232.

To manage the execution of the virtual nodes, operating system/hypervisor 235 may comprise a control system to manage a schedule that is used to allocate processing resources of processing system 230 to each of the nodes, user sensors 220 to each of the nodes, and other similar resources on satellite device 100. In particular, the schedule may be used to ensure that each application is scheduled to receive processing resources from processing system 230 during defined time periods, and receive access to user sensors 220 during defined time periods. In some implementations, one or more of the applications may execute during the same time period on satellite device 100. These applications may use different sensors in user sensors 220, may time share the use of sensors in user sensors 220, or may use the same data from user sensors 220 in their operation. To allocate the sensors operating system 235 may be responsible for providing each operating virtual node with a communication link to the required user sensor, and deallocating or removing the communication link to the required sensor based on the scheduling. For example, an imaging device may be accessed by virtual node 241 during a first time period, wherein virtual node 241 may access the sensor based on addressing information provided by operating system 235. Once the time period expires, operating system 235 may prevent virtual node 241 from accessing the sensor, in some examples, by removing the addressing access of the virtual node, and allocating access of the sensor to a second virtual node.

Virtual nodes 241-244 may generate, route, or handle communication traffic for delivery to other virtual nodes of other satellite devices in a satellite cluster. The communication resources of at least communication interface 221 can be allocated among virtual nodes 241-244 according to presently available bandwidth or present relative distances among satellite devices when peer communications are employed. When ones of the virtual nodes are executed in parallel or concurrently, then operating system/hypervisor 235 or other control systems can direct at least communication bandwidth allocations of inter-satellite communications among various communication types of the virtual nodes based at least in part on available bandwidth. As bandwidths change, then the bandwidth allocations can also change to prioritize certain traffic types over other traffic.

In addition to the virtual node operations provided in virtualized execution segment 201, satellite device 100 further includes control segment 202. Control segment 202, which may be communicatively linked to virtualized execution segment 201 and interface segment 203, is responsible for logistical control elements of the satellite device 100. These operations may include managing the deployment of solar panels on the satellite, managing power control of modular power units, control of shared power hubs or power control systems, managing the positioning of the satellite device with regards to neighboring satellite devices of a satellite cluster, managing the positioning of the satellite device with regards to the Earth or the sun, performing orbital adjustments, or any other similar operation.

In at least one example, flight control system 211 may monitor for requests from operating system 235, and determine whether the satellite is capable of accommodating the request from operating system 235. For example, virtual node 241 may generate a request to move a user sensor, which also requires movement using propulsion and navigation 210. In response to the request, flight control system 211 may determine that the movement cannot be made, and may prevent the movement of the satellite using propulsion and navigation 210. Further, in some implementations, flight control system 211, may provide a notification to operating system 235 and virtual node 241 indicating that the movement is not permitted. In some examples, due to lack of solar irradiance of solar panels 253 or lack of remaining battery power within battery arrays of power system 212, flight control system 211 might determine that insufficient electrical power is available to perform one or more requested tasks or request from virtual nodes 241-244. Flight control system 211 can report indications of a power status or insufficient power status to one or more of virtual nodes 241-244 or to operating system 235.

In further examples, flight control system 211 can comprise a logistical control system for virtualized execution segment 201 or interface segment 203, and may monitor for requests to adjust relative positioning with respect to at least one neighboring satellite device. These requests can be issued to move satellite devices closer in relative distance to accommodate bursts of communication traffic generated by one or more virtual nodes, where the bursts of traffic desire to have a higher bandwidth communication link than presently established with another satellite device. Likewise, flight control system 211 may monitor for requests from operating system 235 to adjust relative positioning farther from a particular satellite device to either approach another satellite device in relative distance or to resume a nominal position that balances distances between two or more satellite devices. These requests might include cyclic or repeated periodic adjustments that allow for predictable changes in relative distance over the course of time. Various traffic differentiations, traffic prioritizations, quality of service adjustments, or virtual node execution prioritizations can be adjusted concurrent with the relative distance adjustments.

Propulsion and navigation elements 210 can comprise various equipment to move an associated satellite device with respect to neighboring satellite devices, move into different orbital configurations, adjust relative distances among satellite devices, or perform orientation/attitude adjustments. Propulsion and navigation elements 210 might comprise various engines, thrusters, inertial control and manipulation elements, or other elements capable of making adjustments to position, orientation, orbit, speed, or other movement parameters. Propulsion and navigation elements 210 can also comprise distance sensing equipment or navigation equipment to determine relative distances from Earth or from other satellite devices. This distance sensing equipment or navigation equipment can comprise laser ranging equipment, radar equipment, or signal strength sensing equipment. Further examples can employ systems to determine geographic coordinates using one or more global positioning systems (GPS, GLONASS, Galileo), star-tracking systems, visual tracking systems, accelerometer-based tracking systems, or dead-reckoning systems, among others.

Although illustrated as a separate system in the example of FIG. 2, it should be understood that in some examples, flight control system may be implemented and stored on processing system 230 and storage system 232. However, it should also be understood that flight control system may be stored on a separate storage system and use a different processing system than operating system 235 and its corresponding virtual nodes.

Figure 3:
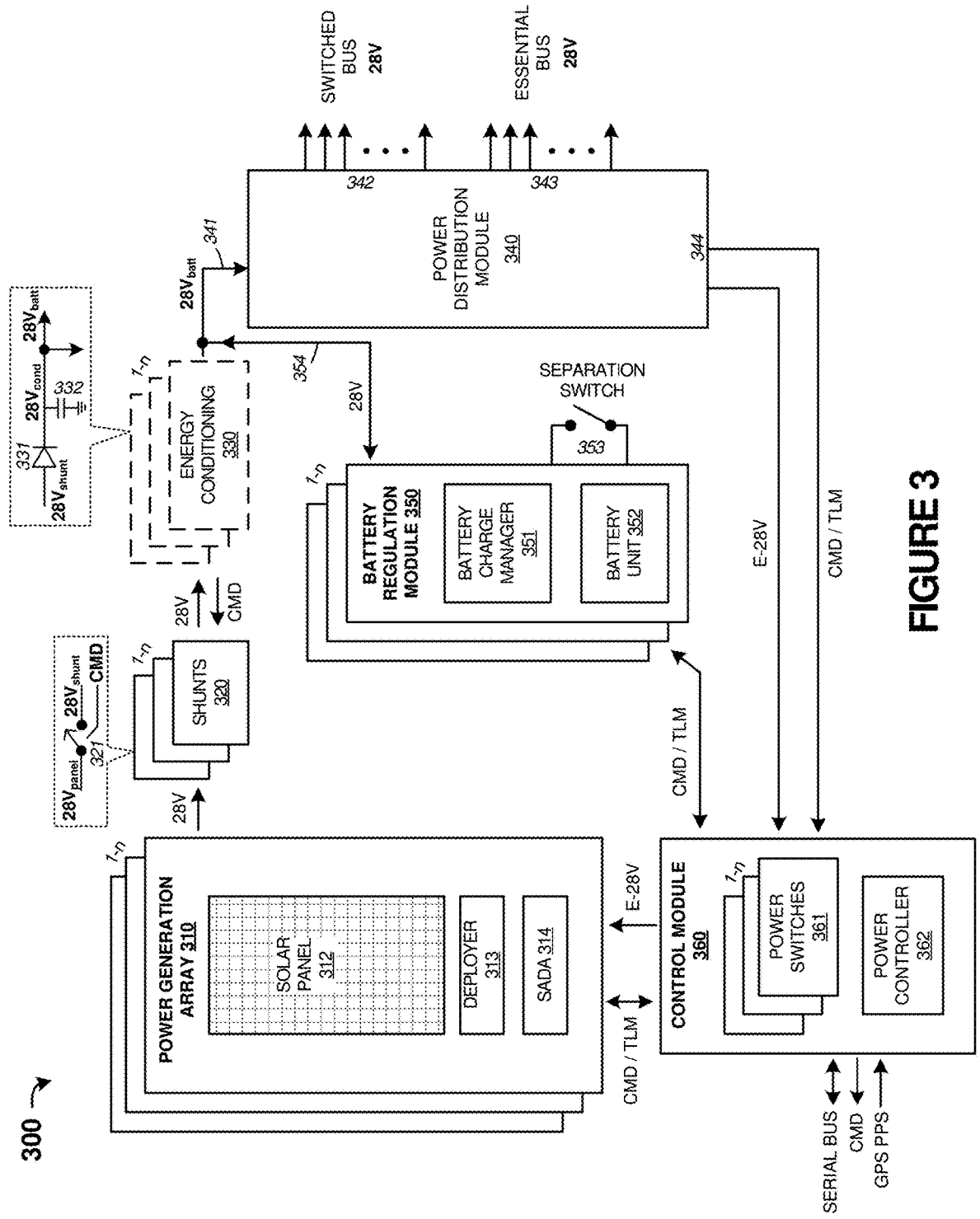
FIG. 3 illustrates an example circuit configuration of a satellite device.

FIG. 3 illustrates example circuit 300 of a satellite device. Circuit 300 includes an array of solar panels, shown as power generation arrays 310. Power generation arrays 310 include photovoltaic solar panels 312 formed from arrays of individual photovoltaic cells. Other electrical power generation components or structures might be employed, such as thermoelectric generators, radioisotope thermoelectric generators, fuel cells, among others. Power generation arrays 310 also each include deployer 313 which deploys solar panels 312 from a stowed position. The stowed position is typically employed during transport and launch of a satellite into an orbit or trajectory. The stowed position can be a folded configuration which positions solar panels 312 proximate to a chassis of a corresponding satellite device. Once deployed, then solar panels 312 can be oriented as-needed to face a light source (such as the sun) or to dynamically regulate an electrical power generation level by orienting solar panels 312 at selected angles with regard to a light source. Solar array drive assembly (SADA) 314 comprises mechanisms and circuitry to orient solar panels 312, such as gimbal devices, servo or motor devices, among others. Portions of power generation arrays 310 can be positioned external or internal to a bus or chassis enclosure of a corresponding satellite.

Any number of power generation arrays 310 can be provided for a satellite device, such as 1-n arrays, depending upon the specific implementation. Power generation arrays 310 provide 28 volts (V) as an output, which can be individually provided over separate power links to shunts 320 and energy conditioning module 330. Shared power links or buses can also be employed. For operation of elements of Power generation arrays 310, such as deployer 313 or SADA 314, 28V or other voltage may be provided as shown in FIG. 3 for "E-28V" comprising an 'essential' bus for 28V power. The essential bus typically comprises an unswitched or constantly on power bus, in contrast to the switched 28V bus discussed below. It should be understood that other voltage levels might be produce, distributed, and managed by circuit 300. Furthermore, one or more control signals can be provided to power generation arrays 310, such as to initiate deployment operations or to instruct orientation by SADA 314. Telemetry (TLM) can be provided by power generation array 310 to indicate current status, orientation, alignment, failures, deployment state, or other information to control module 360.

Once solar panels 312 are deployed and oriented into a desired configuration, then power generation arrays 310 can provide electrical power (28V panel) for use in a corresponding satellite device. In FIG. 3, one or more shunts 320 are provided, although shunts 320 are optional. However, when employed, shunts 320 can control output of electrical power from power generation arrays 310 to further elements of circuit 300 as $28V_{shunt}$. Shunts 320 may be configured to selectively open circuits or links which carry output power from solar panels 312. Shunts 320 may comprise circuit breaker elements, switching elements, or solar panel shorting elements. Shunts 320 can receive commands from other elements of circuit 300, such as from energy conditioning module 330 or control module 360, among others. These commands indicate when to activate a shunting function when shunts are employed, or when to break/short a circuit connection when other configurations are employed for shunts 320. In FIG. 3, an example of shunts 320 are shown as comprising switching element 321 which is controlled by a command signal (CMD). However, in further implementations, other configurations of shunts 320 can be employed. For example, shunts 320 may be configured to direct output links of solar panels 312 to a ground/reference potential in some examples, or may instead direct excess electrical power through one or more resistive elements to generate heat with excessive power from solar panels 312. In yet further examples, shunts 320 may be configured to generate at least a portion of the heat used to heat one or more battery arrays included in circuit 300.

Optional energy conditioning modules 330 receive 28V electrical power from 1-n shunts 320 as $28V_{shunt}$ (or $28V_{panel}$ directly from power generation arrays 310 when shunts 320 are not employed). This 28V power is typically unregulated by voltage regulators or DC-to-DC converters in this portion of circuit 300. Energy conditioning modules 330 can include diode elements 331 to restrict the flow of energy or current from downstream elements back into upstream elements, such as solar panels 312. Energy conditioning modules 330 may also comprise one or more capacitors 332 to condition the 28V output from solar panels 312 into $28V_{cond}$. Although not required, these capacitors can reduce noise, variation, and fluctuation on the 28V power links provided by solar panels 312. In direct energy transfer (DET) examples, even though capacitors might be employed to reduce noise, variation, or fluctuations in the 28V links, a voltage regulation circuit is not employed. Thus, downstream components receive a 'raw' or un-regulated version of the 28 VDC power from solar panels 312, except for any conditioning provided by the capacitors. The amount of capacitance included and type of capacitor can vary based on implementation. Energy conditioning modules 330 provides the conditioned 28 VDC as $28V_{cond}$ to battery regulation module 530. However, $28V_{cond}$ is shared at an electrical node with 28 VDC provided by battery arrays of battery regulation module 530 ($28V_{batt}$).

Battery regulation module 530 comprises an energy storage system comprising one or more arrays of batteries or battery cells, as well as battery charging and management elements. Battery unit 352 comprises these arrays, and battery charge manager 351 comprises battery charging and management elements. Furthermore, separation switch 353 is included. Separation switch 353 can be included to ensure batteries are disconnected from any external circuit during manufacturing, shipment, and launch. Once launched or deployed into orbit, separation switch 353 can close to allow batteries to interface with other elements of circuit 300.

Battery regulation module 530 or other portions of circuitry 300 might also include over-voltage and over-current protection circuitry. This over-voltage and over-current protection circuitry can protect downstream circuit components from receiving too high of a voltage or current during transient events, such as ensuring a predetermined margin above and/or below a predetermined voltage or a predetermined current. Over-voltage and over-current protection circuits can include Zener diodes, surge suppressors, thyristors, crowbar circuitry, fuses, circuit breakers, and the like.

Battery unit 352 includes one or more battery arrays (1-n). These battery arrays include individual battery cells which store electrical energy produced by solar panels 312. In circuit 300, 28V is produced by solar panels 312, which may comprise conditioned 28 VDC ($28V_{cond}$), or may include noise, variation, fluctuation, and the like. This 28 VDC is provided to battery regulation module 530. When capacitors are not employed in energy condition modules 330, then $28V_{shunt}$ or $28V_{panel}$ can be provided to energy storage system 330 including any noise, variation, fluctuation. This energy is introduced to the one or more battery arrays included in battery unit 352 for storage and supply to further components of circuit 300. In some examples, the battery arrays comprise individual batteries or battery cells that conform to an "18650" form factor and comprise lithium ion cells. Other form factors and cells can be employed, along with other energy storage technologies, including different battery chemistries, fuel cells, and kinetic storage devices, among others.

Battery regulation module 530 can receive input power over link 354 for storage in battery unit 352 concurrently with providing output energy on link 354 as $28V_{batt}$ to downstream elements of circuit 300. Battery unit 352 also can provide a power conditioning function due to the energy storage capability of the associated batteries. This power conditioning function can include reducing noise, fluctuations, or variations in power received from solar panels. Moreover, dips in power output from the solar panels can be mitigated by the battery arrays, which can provide output power to downstream elements when voltages or currents of the solar panels fall below threshold levels. When the voltages or currents of the solar panels exceed the threshold levels, then battery regulation module 530 can charge the associated batteries. Battery regulation module 530 includes circuitry, processing elements, and data storage elements to handle effective charging of the associated batteries and corresponding battery chemistry. Each particular chemistry of different battery types might require different charging, monitoring, and maintenance techniques. Battery regulation module 530 can include corresponding logic or processing elements to compensate for at least the particular battery type or battery chemistry employed.

Battery regulation module 530 can also receive commands (CMD) from control module 360 over one or more associated links. Battery regulation module 530 can provide telemetry and status information to control module 360 over one or more associated links. The commands or instructions can include commands to open/close separation switch 353, battery heater control instructions, as well as battery charge and output control commands. The telemetry or status can include battery status, battery fullness information, charge rate information, failure information, battery temperature information, and other status or telemetry.

Power distribution module 340 receive 28 VDC power from upstream elements over link 341, which can comprise $28V_{batt}$ provided by battery regulation module 350. Power distribution module 340 then distributes this 28 VDC to other components of a satellite system over one or more electrical buses. A first type of bus is a switched bus 342. Switched bus 342 comprises one or more power links that provide 28 VDC to other components of a satellite system. Each power link of switched bus 342 can be enabled or disabled via control signals, such as control or command signaling received over portions of links 344. Switching status (on/off) of each link can be provided to control unit 360 over further portions of links 344. A second type of bus is an essential bus 343. Essential bus 342 comprises one or more power links that provide 28 VDC to other components of a satellite system. Essential bus 342 is not switched and remains active as long as power is presented by either battery unit 352 or solar panels 312. In this manner, a switched bus allows for accessory components of a satellite system to be switched on and off according to various operating conditions, while other components always receive power. The essential bus can be referred to herein as E-28V.

Control module 360 comprises various processing circuitry, monitoring circuitry, and other elements to control and command elements of circuit 300. Power switches 361 can selectively provide E-28V power to certain components directly controlled by control module 360, such as power generation arrays 310. Power controller 362 comprises one or more processing units including microprocessors, logic circuitry, programmable logic devices, field-programmable gate arrays (FPGAs), application specific integrated circuits (ASICs), among other processing circuitry. Furthermore, one or more memory or data storage elements can be included in power controller 362 to store executable instructions usable by any of the processing units. Elements of control module 360 can operate off of the E-28V power either directly or using one or more step-down converters or voltage regulators to provide appropriate voltages for the circuitry employed.

In specific examples, control module 360 and the processing units can receive telemetry from components of circuit 300, process that telemetry, and determine sun/light source orientations, overcurrent conditions for solar panels 312, control of solar panel deployment and positioning, battery charging status, power distribution switch status, and other information or operational control. Furthermore, control module 360 can communicate to provide any monitored status of circuit 300 over one or more external devices over a serial bus, discrete status/control links, network links, among other links. In some examples, positioning data or information (GPS PPS) can be provided to control module 360 in order to determine proper alignment of solar panels 312, among other functions.

The arrangement of elements of circuit 300 can vary among modular components of a power system. In a first example, power generation arrays 310 are included as modules separate from control module 360 and other components of circuit 300. Furthermore, individual instances of shunts 320, energy conditioning modules 330, and battery regulation modules 350 can each be included in modular power units, such as power units 110 in FIG. 1. A modular control unit, such as power control module 120 in FIG. 1, can comprise selected elements of circuit 300, such as control module 360 and power distribution module 340, among other elements.

Figure 4:
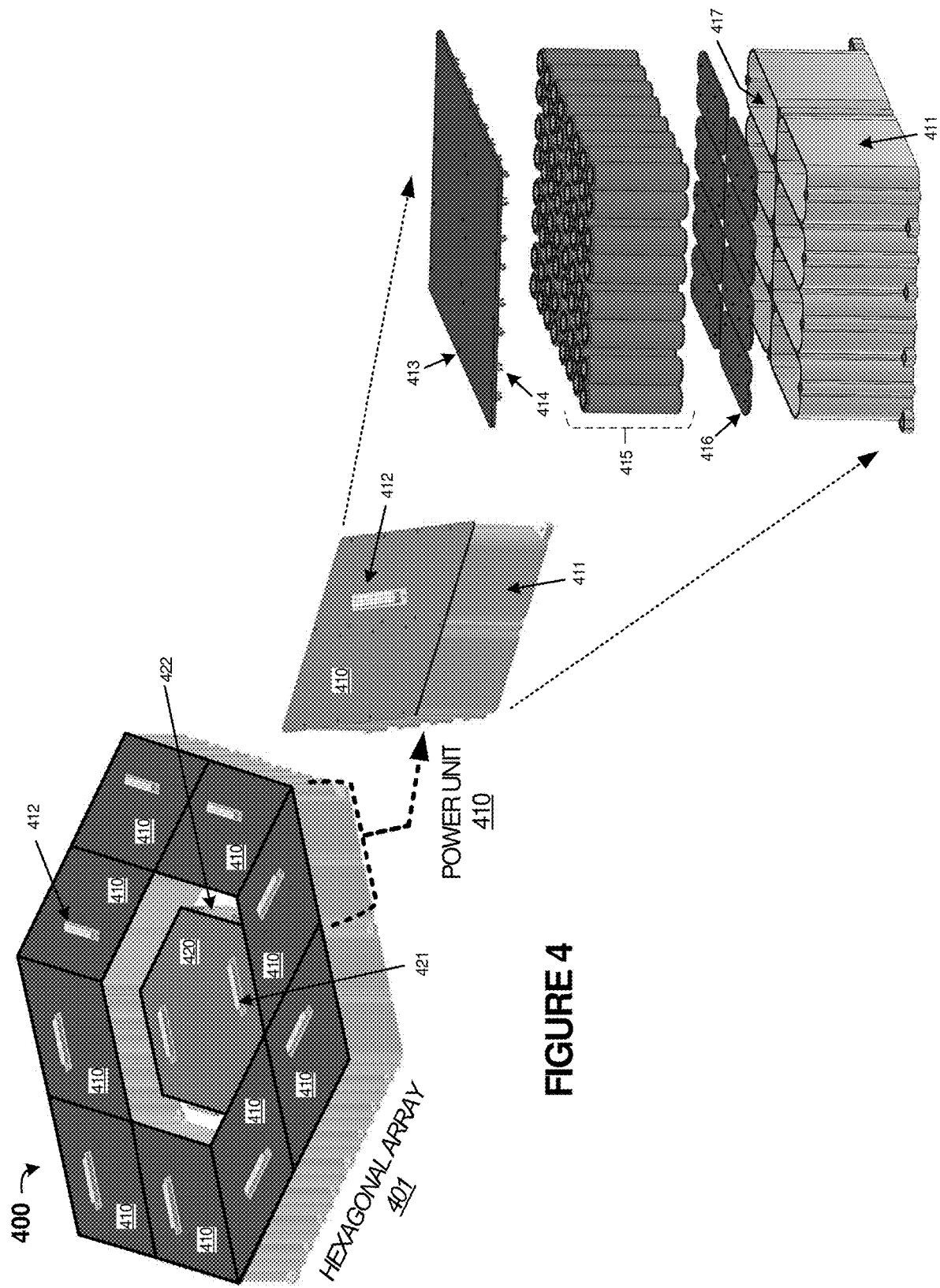
FIG. 4 illustrates a satellite device power unit and hexagonal configuration according to an implementation.

Turning now to specific implementations of modular units which can form portions of circuit 300, FIGS. 4-10 are presented. FIG. 4 illustrates a satellite device power unit and hexagonal array configuration 400 according to an implementation. In configuration 400, nine rhomboid power units 410 are combined into an array to form hexagonal array 401. Power units 410 form a quasi-ring structure which surrounds central power control unit 420. Power control unit 420 might be elevated above or below the level of surrounding power units 410. Each power unit 410 in configuration 400 includes one or more electrical connectors which can couple an associated power unit to power control unit 420. Specifically, connector 412 is included on each power unit 410 which couples power output and control/telemetry to power control unit 420 via connectors 422. Connectors 421 on each power control unit 420 can be employed to couple output power from power control unit 420 to further downstream elements of a satellite device. Various cabling, wires, or other conductive media are employed to electrically and communicatively coupled power units 410 to power control unit 420. In addition to electrical power couplings, control and status/telemetry signaling can also be carried by connectors 412, 421, and 422. Connectors 421 on each power control unit 420 might also be employed to electrically couple to a corresponding solar array or solar panel.

A detailed view of an exemplary power unit 410 is shown in FIG. 4, although variations are possible. Power unit 410 comprises an enclosure, chassis, or casing which forms a plurality of compartments or battery pods 417 into which a plurality of batteries 415 can be held. This casing also structurally supports elements of power unit 410. The power unit chassis or casing typically comprises at least two compartments or battery pods 417 configured to physically isolate at least a first portion of a plurality of batteries from a second portion of the plurality of batteries. Thus, various sets of batteries are physically isolated from each other in the power units. A vertical height of each power unit 410 is partially determined by the height of the corresponding batteries and circuit board stackups. In the example shown in FIG. 4, eight (8) battery cells are held per battery pod 417, for a total of 64 batteries when 8 pods are included in casing 411.

Each battery pod 417 is surrounded by metallic material of casing 411, which can be machined, additively manufactured, or cast to include features to mechanically support and surround the corresponding batteries. Additionally, each battery pod 417 can include conformal material to surround and support each battery. In some examples, this includes potting material, such as epoxy, glue, clay, asbestos, fiberglass, carbon fiber, or other material, including combinations thereof. The potting material might comprise thermally conductive material that is electrically insulating, such as thermal epoxy. Having thermally conductive material advantageously allows for thermal normalization within each battery pod 417. Moreover, the potting material can limit propagation of failures of individual battery cells to single battery pods, instead of allowing the failures to propagate to further battery pods. Thus, a failure of a battery can be limited to 7 further batteries within a battery pod. The failed pod can be electrically disconnected from the remaining circuitry to allow for continued operation of power unit 410 after one or more battery pod failures.

Within each battery pod 417, a corresponding bottom circuit board 416 is inserted below the battery cells. Circuit board 416 can be employed to electrically couple bottom terminals of batteries 415 in each battery pod together into a desired series or parallel connection configuration. One particular configuration is to couple the individual batteries to produce a 28V arrangement. For lithium ion battery cells with 3.6-3.7 volt nominal voltages, this might include a series connection of the 8 battery cells per battery pod. Top circuit board 413 is included and in this example implementation spans across all battery pods to form a cover over all battery pods. In other examples, individual top circuit boards might be employed for each battery pod. Spring contacts 414 are included for each battery 415 to form a compressive configuration to hold each battery into place for both mechanical stability and electrical conductivity during movement, vibration, and other mechanical transients. Although spring contacts 414 are include on top circuit board 413, these can instead be included on bottom circuit boards 416 or on any combination thereof. Top circuit board 413 also includes one or more connectors 412 and various circuitry and heating elements which will be discussed in FIGS. 5 and 6.

Batteries 415 are inserted into each battery pod 417. As shown in FIG. 4, the battery cells can comprise individual cylindrical cells, which conform to a particular form factor. For example, the battery cells might conform to the 18650 form factor and comprise lithium ion chemistry battery cells which have capacity ratings of approximately 1500-3600 milliamp-hours (mAh) and voltage ratings of around 3.6 volts. The 18650 form factor is approximately 65 millimeters (mm) or 2.56 inches (in) long and 16 mm to 18 mm in diameter. However, 18650 form factor may be as long as 68 mm or 2.68 in when internal protection circuits are included. Other form factors might be employed, such as the 20700 or 21700 cell form factors, among others. Other battery chemistries with characteristic capacities and voltages might be employed, such as nickel metal hydride (NiMH), lithium, lithium air, or nickel cadmium (NiCd), among others. Regardless of the selected battery chemistry or form factor, batteries 415 each comprise rechargeable cells.

When bottom circuit boards 416, batteries 415, and top circuit board 413 are coupled together, these elements secure batteries 415 into each associated battery pod 417. Bottom circuit boards 416 might be unsecured into each battery pod until compressed by batteries 415 and top circuit board 413, along with any potting material inserted into each pod. Fasteners or adhesives might instead be employed to secure bottom circuit boards 416 into each pod. Top circuit board 413 can be coupled to casing 411 using one or more fasteners, such as screws, or might instead use an adhesive to couple to casing 411. In FIG. 4, screw hole features are included in casing 411 to couple to screws which hold top circuit board 413 against a top side of casing 411. When coupled together, casing 411 and top circuit board 413 might form a sealed enclosure. One or more gaskets or other sealing elements can be included between casing 411 and top circuit board 413 to ensure gas-tight or liquid-tight fit for each battery pod.

Figure 5:
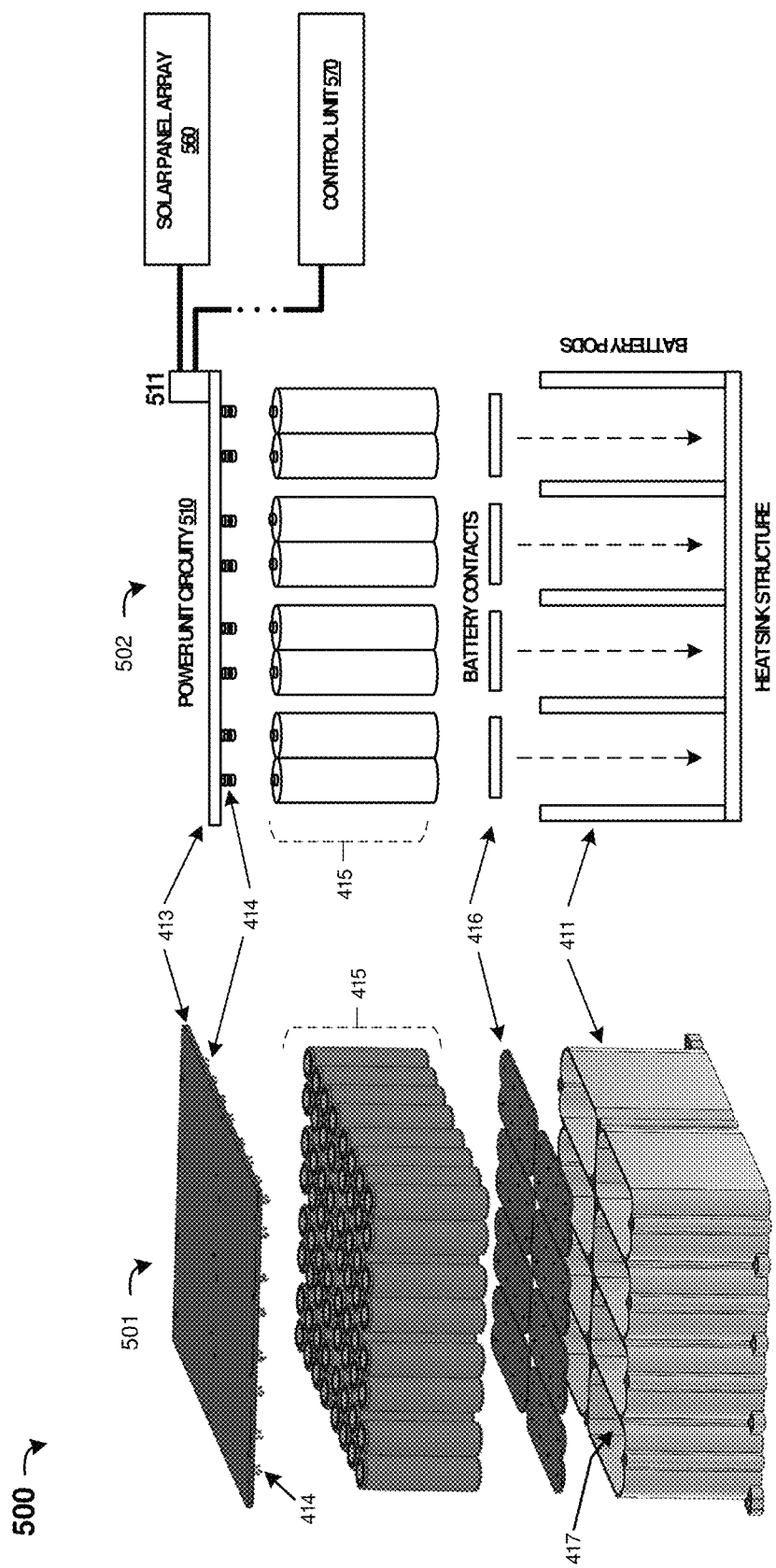
FIG. 5 illustrates a satellite device power unit according to an implementation.

FIG. 5 illustrates a further example of satellite device power unit 500 according to an implementation. In FIG. 5, perspective view 501 illustrates similar elements as seen in FIG. 4, although variations are possible. An exploded side view 502 is shown which further details the components which comprise power unit 500. As can be seen in view 502, top circuit board 413 comprises power unit circuitry 510, battery contacts 414, and one or more connectors 511. Connector 511 couples power links to solar panel array 560, which comprises one or more photovoltaic solar cells and provides input power to power unit circuitry 510. Connector 511 also couples output power and various control/status signaling to control unit 570. Control unit 570 might comprise a power control module, such as power control module 420 in FIG. 4.

Batteries 415 are shown positioned above lower battery contacts on circuit boards 416. Battery pods 417 are formed by cavities formed by casing 411. Furthermore, a heatsink structure can be formed by a bottom member of casing 417 which dissipates excess heat from batteries 415 to thermal dissipation features of a corresponding satellite device. This heatsink structure can include further portions of casing 411, and can thermally couple casing 411 to one or more external heat radiator elements of a corresponding satellite.

Figure 6:
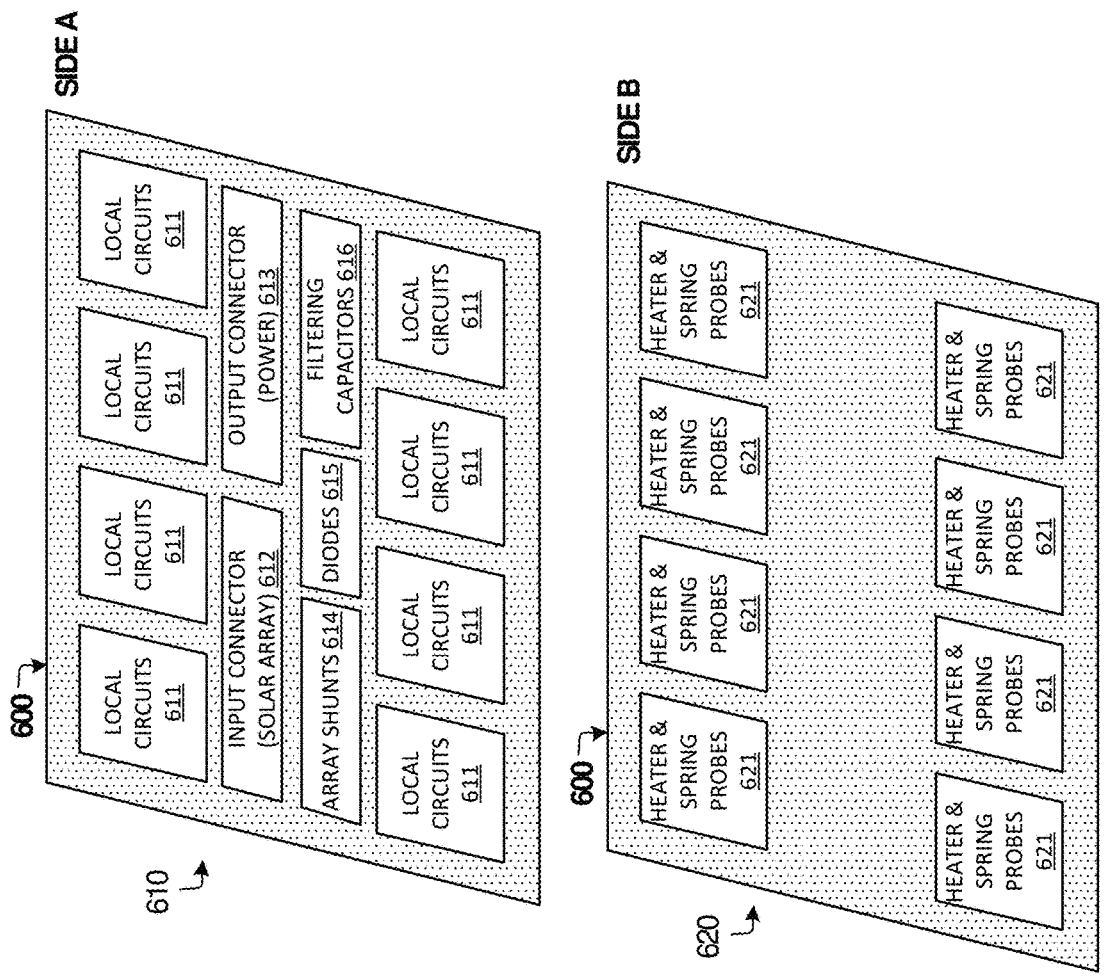
FIG. 6 illustrates satellite device circuit boards according to an implementation.

FIG. 6 illustrates satellite device circuit assembly 600 according to an implementation. Circuit assembly 600 can be an example implementation of top circuit board 413, which might comprise power unit circuitry 510 in FIG. 5. In FIG. 6, first circuitry 610 is shown in side 'A' view, while second circuitry 620 is shown in side 'B' view. Although the terminology 'top' and 'bottom' are used herein, it should be understood that these terms are merely exemplary and other corresponding terms for each side of circuit assembly 600 can be used. When employed in a power unit, circuit assembly 600 comprises a main circuit board for the power unit, and is also configured to provide a portion of the electrical contacts among terminals of batteries installed into a plurality of battery pods or compartments. In FIG. 6, circuit assembly 600 includes input circuitry for connection to solar arrays or solar panels, charging circuitry for maintaining charge on the batteries, and output circuitry for providing power to downstream elements, such as a power control module.

Specifically, first circuitry 610 includes local circuits 611, input connector 612, output connector 613, solar array shunts 614, diodes 615, and filtering capacitors 616. Input connector 612 is configured to couple to one or more solar panels or solar arrays. Output connector 613 is configured to couple to downstream components, such as a power control module or other components of a satellite device. In some examples, input connector 612 and output connector 613 comprise the same connector.

Local circuits 611 comprise energy conditioning circuitry, over-voltage protection circuitry, over-current protection circuitry, battery regulation circuitry, battery charge manager circuitry, thermal heater control circuitry, temperature monitoring circuitry, separation switching elements, status/telemetry circuitry, command interpretation circuitry, and various support logic and circuitry. Local circuits 611 can be segregated among each battery pod, such as for each pod 417 of FIG. 4 and corresponding set of batteries. However, local circuits 611 might also have shared components or be combined into a single local circuit portion. Typically, local circuits 611 comprise element discussed above for battery regulation module 350 of FIG. 3.

Further circuitry includes solar array shunts 614, which comprise elements similar to shunts 320 of FIG. 3. Array shunts 614 allow for selective electrical coupling of solar panel outputs to the remaining circuitry of circuit assembly 600. Diodes 615 can limit current flow in a desired direction to prevent backflow of current into the associated solar panels. Filtering capacitors 616 can comprise one or more capacitance elements that reduce fluctuations and noise in power outputs provided by the solar panels. Both diodes 615 and filtering capacitors 616 can be included in energy conditioning modules 330 of FIG. 3.

Second circuitry 620 includes heater circuitry and spring probes 621. Heater circuitry comprises one or more heater elements configured to produce a target temperature in a corresponding battery compartment or pod. Associated batteries of each battery pod can thus be kept within a target temperature range. When deployed into a space environment, such as into orbit, temperatures can be lower than desired for particular battery chemistries to function effectively. Example temperature ranges for batteries might be between 0 degrees Celsius (° C.) to 60° C., depending upon the battery chemistry and construction. An optimal range within the operating range might be established as 10° C. to 20° C. Heater circuitry can regulate this temperature to within the optimal range. Combined with the heater portions, various heating control circuitry is included. This circuitry can include temperature monitoring elements, such as thermocouples, temperature sensors, and other similar elements. Logic or control circuitry can ensure that the heating elements are turned on to heat and turned off to withhold heating and keep each battery pod, and corresponding batteries, to within the target temperature range. Heater circuitry and spring probes 621 can be segregated among each battery pod, such as for each pod 417 of FIG. 4 and corresponding set of batteries. However, heater circuitry and spring probes 621 might also have shared components or be combined into a single circuit portion.

As discussed in FIGS. 4 and 5 for elements 414, conductive spring elements can be included to form electrical contacts with individual battery cells. Moreover, the spring force provided by each spring element can maintain positioning of each battery within a corresponding battery pod and maintain electrical contact during periods of vibration, agitation, temperature fluctuation, and other mechanically variable conditions.

FIGS. 7-10 illustrate example configurations of polygonal-shaped power units formed into a combined geometric arrangement by disposing the polygonal-shaped power units about a power control module within a satellite chassis.

Figure 7:
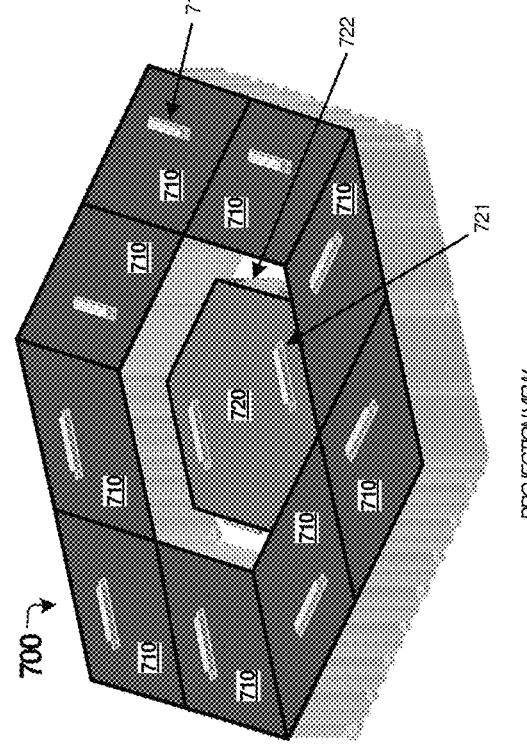
FIG. 7 illustrates a filled hexagonal configuration of power units according to an implementation.
Figure 7:
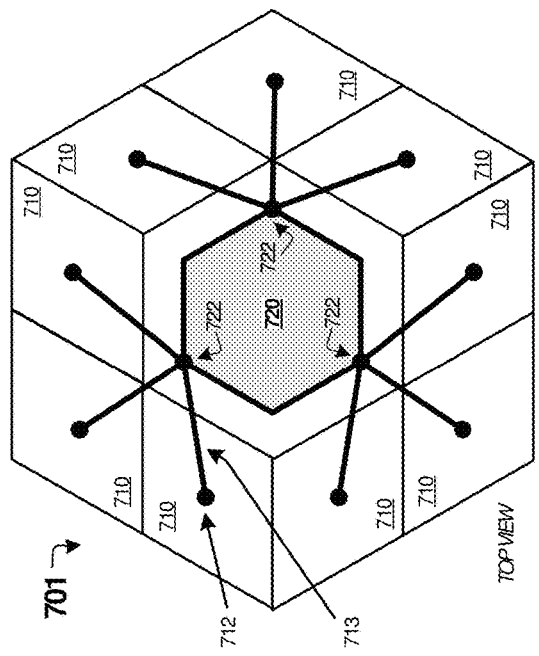

FIG. 7 illustrates a filled hexagonal configuration of power units according to an implementation. View 700 is projection view, view 701 is top schematic view. In FIGS. 7-10, each of power units 710 comprise rhomboid shapes. Nine rhomboid prism power units form a hexagonal array when coupled together and disposed about central power control module 720. Although FIGS. 7-10 might show gaps between the rhomboid power units and power control module 720, it should be understood that the gaps might be eliminated in other examples. For example, in some examples, power control module 720 might couple to each rhomboid power unit 710. In other examples, a gap might be included between power control module 720 and each rhomboid power unit 710. In yet further examples, the central space formed by the hexagonal array might instead be filled with further rhomboid (or other shaped) power units 710, with power control module 720 located elsewhere in relation to the hexagonal array.

Power units 710 each comprise components related to handling power from one or more solar panels, not shown in FIGS. 7-10. Each connector 712 can receive power output by a corresponding solar panel. Each power unit 710 also include various switching, control, and energy storage circuitry to store power output of the corresponding solar panel in an array of batteries. Each power unit 710 can then provide conditioned unit power, such as 28 VDC, over one or more power links to power control unit 720. This unit power can be provided over connector 712 and power links 713, or other connectors/links of the power units.

Power control unit 720 can receive unit power from each individual power unit 710 over connectors 722 and associated unit power links 713. In addition to providing various control and monitoring for individual power units 710, power control unit 720 provides one or more output power links comprising both switched voltage buses and constant (essential) voltage buses to downstream elements of a satellite system. These output power links can be provided over connector 721. Individual power units 710 and power control unit 720 can couple together or individually couple to a deck or shelf within a satellite device. In some examples, a rack or chassis frame are included to secure power units 710 and power control module 720 into the hexagonal or other-shaped array.

Figure 8:
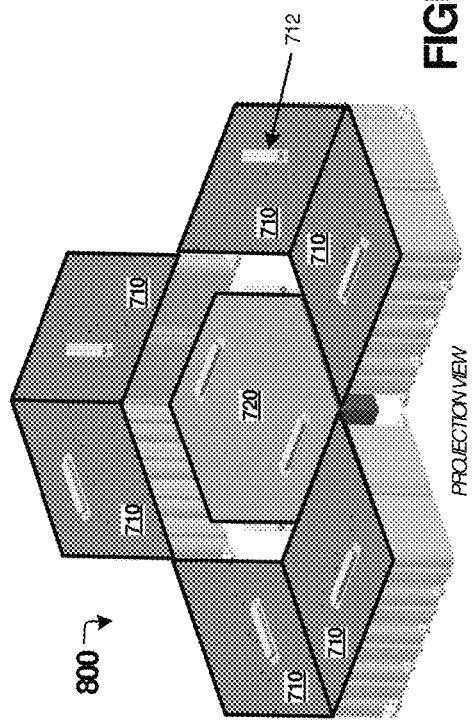
FIG. 8 illustrates a partially-filled hexagonal configuration of power units according to an implementation.
Figure 8:
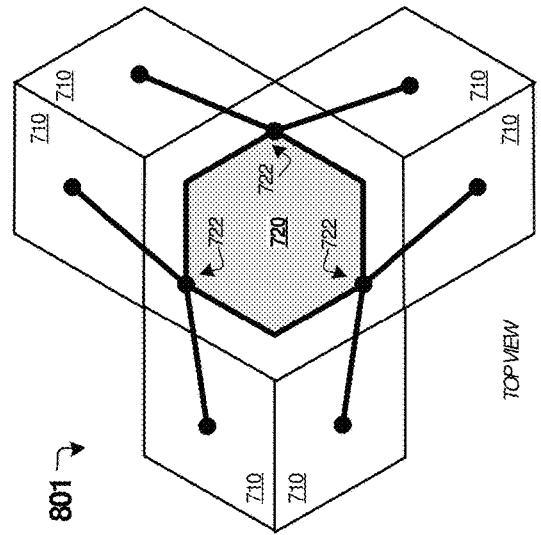

FIG. 8 illustrates a partially-filled hexagonal configuration of power units 710 according to an implementation. View 800 is projection view, while view 801 is top schematic view. Six rhomboid prism power units 710 form partially populated hexagonal array. Power units 710 are disposed around a central power control module 720, and coupled via associated power links.

FIG. 9 illustrates a sparse hexagonal configuration of power units 710 according to an implementation. View 900 is projection view, while view 901 is top schematic view. Three rhomboid prism power units 710 form a sparsely populated hexagonal array or a fan blade configuration. Power units 710 are disposed around a central power control module 720, and coupled via associated power links.

FIG. 10 illustrates a compact hexagonal configuration of power units according to an implementation. View 1000 is projection view, while view 1001 is top schematic view. Three rhomboid prism power units 710 form hexagonal array in tight-packed configuration, with power control module 720 located above or below the tight hexagonal array. In FIG. 10, individual rhomboid power units 710 do not surround a central power control module, and instead are located together in an interlocking manner.

The included descriptions and figures depict specific implementations to teach those skilled in the art how to make and use the best option. For the purpose of teaching inventive principles, some conventional aspects have been simplified or omitted. Those skilled in the art will appreciate variations from these implementations that fall within the scope of the disclosure. Those skilled in the art will also appreciate that the features described above can be combined in various ways to form multiple implementations. As a result, the invention is not limited to the specific implementations described above, but only by the claims and their equivalents.

What is claimed is:

1. A satellite device, comprising:
   a chassis;
   a power control module; and
   an array of polygonal-shaped power units formed into a combined geometric arrangement by disposing the polygonal-shaped power units about the power control module within the chassis;
   wherein each of the power units comprise:
      a power unit chassis having the polygonal-shaped configuration and configured to hold a plurality of batteries configured to store energy received from at least one photovoltaic solar panel of the satellite device; and
      at least one connector configured to receive the energy from the at least one photovoltaic solar panel and provide a unit voltage to the power control module.

2. The satellite device of claim 1, wherein the power units comprise rhomboid shapes, and wherein the geometric arrangement comprises a hexagonal arrangement formed by a combination of the rhomboid shapes about a central axis.

3. The satellite device of claim 1, further comprising:
   the at least one photovoltaic solar panel coupled to the chassis; and
   at least one of the power units configured to receive electrical power from the at least one photovoltaic solar panel and produce a unit voltage to the power control module.

4. The satellite device of claim 3, wherein the power control module provides at least one output voltage to one or more components of the satellite device.

5. The satellite device of claim 1, wherein the plurality of batteries each conform to an 18650 form factor and comprise lithium ion cells.

6. The satellite device of claim 1, wherein the plurality of batteries are configured to condition the energy from the at least one photovoltaic solar panel to produce the unit voltage.

7. The satellite device of claim 1, wherein the power unit chassis comprises at least two compartments configured to physically isolate at least a first portion of the plurality of batteries from a second portion of the plurality of batteries.

8. The satellite device of claim 1, each of the power units further comprising:
   one or more heater elements configured to produce a target temperature in the power unit chassis for the plurality of batteries.

9. A satellite device power system, comprising:
   a power control module; and
   an array of modular power units formed into a combined geometric arrangement by disposing the modular power units about the power control module;
   wherein each of the modular power units comprise:
      a power unit chassis configured to hold a plurality of batteries configured to store energy received from at least one photovoltaic solar panel of the satellite device; and
      at least one connector configured to receive the energy from the at least one photovoltaic solar panel and provide a unit voltage to the power control module.

10. The satellite device power system of claim 9, wherein the modular power units comprise rhomboid shapes, and wherein the geometric arrangement comprises a hexagonal arrangement formed by a combination of the rhomboid shapes about a central axis.

11. The satellite device power system of claim 9, further comprising:
   at least one of the modular power units configured to receive electrical power from the at least one photovoltaic solar panel and produce a unit voltage.

12. The satellite device power system of claim 11, wherein the power control module provides at least one output voltage to one or more components of the satellite device.

13. The satellite device power system of claim 9, wherein the plurality of batteries each conform to an 18650 form factor and comprise lithium ion cells.

14. The satellite device power system of claim 9, wherein the plurality of batteries are configured to condition the energy from the at least one photovoltaic solar panel to produce the unit voltage.

15. The satellite device power system of claim 9, wherein the power unit chassis comprises at least two compartments configured to physically isolate at least a first portion of the plurality of batteries from a second portion of the plurality of batteries.

16. The satellite device power system of claim 9, each of the modular power units further comprising:
   one or more heater elements configured to produce a target temperature in the power unit chassis for the plurality of batteries.

17. A satellite power unit, comprising:
   a rhomboid enclosure that provides arrangement into a hexagonal array when coupled to rhomboid enclosures of further satellite power units;
   a plurality of battery compartments formed into the rhomboid enclosure and configured to physically isolate sets of batteries installed into the rhomboid enclosure;
   an input circuit configured to receive electrical source power provided by a solar panel;

a charging circuit configured to charge the batteries using at least the electrical source power;

an output circuit configured to provide unit output power selected among the electrical source power and stored energy provided by the batteries; and one or more heater elements configured to produce a target temperature in the plurality of battery compartments.

18. The satellite power unit of claim 17, wherein the batteries each conform to an 18650 form factor and comprise lithium ion cells.

19. The satellite power unit of claim 17, further comprising:

battery compartment circuit boards each configured to fit within a corresponding one of the plurality of battery compartments and provide electrical contacts among first terminals of associated batteries installed into the corresponding one of the plurality of battery compartments; and a main unit circuit board configured to provide electrical contacts among second terminals of the batteries installed into the plurality of battery compartments, wherein the main unit circuit board comprises the input circuit, the charging circuit, the output circuit, and the one or more heater elements.

20. The satellite power unit of claim 19, wherein the main unit circuit board mates to the rhomboid enclosure to contain the batteries within the plurality of battery compartments and provide environmental sealing for the plurality of battery compartments.

* * * * *